United States Patent
Feldtkeller

(10) Patent No.: US 7,068,486 B2
(45) Date of Patent: Jun. 27, 2006

(54) HALF-BRIDGE CIRCUIT AND METHOD FOR DRIVING THE HALF-BRIDGE CIRCUIT

(75) Inventor: Martin Feldtkeller, München (DE)

(73) Assignee: Infineon Technologies AG, Munich (DE)

( * ) Notice: Subject to any disclaimer, the term of this patent is extended or adjusted under 35 U.S.C. 154(b) by 532 days.

(21) Appl. No.: 10/261,848

(22) Filed: Sep. 30, 2002

(65) Prior Publication Data

US 2003/0067728 A1 Apr. 10, 2003

(30) Foreign Application Priority Data

Sep. 28, 2001 (DE) .................. 101 47 882

(51) Int. Cl.
*H02H 3/26* (2006.01)
(52) U.S. Cl. .................. 361/100; 327/109
(58) Field of Classification Search ........... 327/109; 361/100
See application file for complete search history.

(56) References Cited

U.S. PATENT DOCUMENTS

| 5,099,138 | A |   | 3/1992  | Fukunaga |
|-----------|---|---|---------|----------|
| 5,272,392 | A | * | 12/1993 | Wong et al. ............ 327/109 |
| 5,356,118 | A |   | 10/1994 | Schneider |
| 5,365,118 | A | * | 11/1994 | Wilcox .................. 327/109 |
| 5,666,280 | A | * | 9/1997  | Janaswamy et al. ..... 363/98 |
| 5,864,211 | A | * | 1/1999  | Kiermeier ............... 315/127 |

FOREIGN PATENT DOCUMENTS

DE        40 32 014 A1        5/1991

* cited by examiner

*Primary Examiner*—Lynn Feild
*Assistant Examiner*—Michael Rutland-Wallis
(74) *Attorney, Agent, or Firm*—Laurence A. Greenberg; Werner H. Stemer; Ralph E. Locher

(57) ABSTRACT

A half-bridge circuit has first and second semiconductor switches, which have load paths connected in series and which are driven in dependence on an input signal that is applied to an input terminal. At least one first drive circuit is provided, which is connected to the control connection of the first semiconductor switch and which makes a first drive signal available. The first drive signal is dependent on the input signal and on a current from or to the control connection of the second semiconductor switch.

11 Claims, 3 Drawing Sheets

HALF-BRIDGE CIRCUIT AND METHOD FOR DRIVING THE HALF-BRIDGE CIRCUIT

BACKGROUND OF THE INVENTION

FIELD OF THE INVENTION

The present invention relates to a half-bridge circuit that has first and second semiconductor switches each with a control connection and a load path and whose load paths are connected in series. An output terminal is disposed between the load paths of the semiconductor switches and an input terminal is provided to which an input signal is applied. At least one first drive circuit is provided and has an output that is connected to the control connection of the first semiconductor switch and at which a first drive signal is available.

Half-bridge circuits such as these with two semiconductor switches, in particular power MOS transistors, are generally known and are described, for example, in Published, Non-Prosecuted German Patent Application DE 40 32 014 A1, corresponding to U.S. Pat. No. 5,099,138, or U.S. Pat. No. 5,365,118.

Half-bridge circuits such as these are frequently operated with an inductive load. In order to keep any power loss low, the time period during which the two semiconductor switches are switched off should in this case be kept as short as possible. On the other hand, it is absolutely essential to avoid both semiconductor switches being switched on at the same time. It is thus necessary to identify as accurately as possible the time at which one of the semiconductor switches turns off (non-conducting) and the earliest time at which the other may be switched on.

In order to prevent both semiconductor switches from being switched on at the same time, it is known, after a switching-off signal for one of the semiconductor switches, for the other semiconductor switch to be switched on only after a time delay.

A circuit such as this is simple to implement, but has the disadvantage that the delay time must be configured with a margin with respect to the longest signal delay that occurs. The greater the extent which the signal delay times can fluctuate, the greater is the delay time and the longer is the time period during which both semiconductor switches remain switched off at the same time.

The Non-Prosecuted, German Patent Application DE 40 320 14 A1 and U.S. Pat. No. 5,365,118 describe half-bridge circuits using power MOS transistors, in which an enable signal for a power MOS transistor that is switched off is not produced until the gate voltage of the other MOS transistor has fallen to a value below a threshold voltage, preferably the threshold voltage of the MOS transistor.

However, power MOS transistors have a gate path resistance that is not negligible. These transistors are normally formed from a large number of identical cells, which each have a gate electrode. In this case, the gate electrodes of a majority of the cells may still be charged, and the cells may therefore still be switched on, while the gate electrodes of the cells which are disposed in the vicinity of the externally accessible gate connection have already been discharged, so that the gate potential which can be tapped off externally, or the gate voltage, has already fallen below a threshold value. There is therefore a risk of the transistor which has been switched off until then being switched on again before the transistor which has been switched on until then has been switched off completely, so that both transistors are switched on during a time period in which the remaining gate charge of the transistor that is to be switched off is being dissipated via the gate path resistance.

SUMMARY OF THE INVENTION

It is accordingly an object of the invention to provide a half-bridge circuit and a method for driving the half-bridge circuit which overcome the above-mentioned disadvantages of the prior art devices and methods of this general type, which ensure that at least one of the transistors is not switched on until the other is safely switched off.

With the foregoing and other objects in view there is provided, in accordance with the invention, a half-bridge circuit. The half-bridge circuit contains a first semiconductor switch having a first control connection and a first load path, a second semiconductor switch having a second control connection and a second load path connected in series with the first load path, an output terminal disposed between the first and second load paths, an input terminal for receiving an input signal, and at least one drive circuit coupled to the input terminal and has an output connected to the first control connection of the first semiconductor switch and outputting a drive signal at the output. The drive circuit receives a signal dependent on the input signal and an enable signal dependent on a current from or to the second control connection of the second semiconductor switch. The drive signal is dependent on the input signal and on the current from or to the second control connection of the second semiconductor switch.

The half-bridge circuit according to the invention has a first and a second semiconductor switch, which each has a control connection and a load path and whose load paths are connected in series with one another. An output terminal is provided for connecting a load connected between the load paths. Furthermore, at least a first drive circuit is provided with an output, which is connected to the control connection of the first semiconductor switch and at which a first drive signal is available. An input terminal is provided to which an input signal is applied. According to the invention, the first drive circuit is supplied with a signal that is dependent on the input signal and a first enable signal that is dependent on a current from or to the control connection of the second semiconductor switch. The first drive signal is dependent on the input signal and on the current from or to the control connection of the second semiconductor switch.

In this case, the first semiconductor switch is preferably not switched on via the enable signal until the discharge current from the control connection of the other semiconductor switch has fallen below a reference value. This ensures that the second semiconductor switch is switched off completely before the first transistor is switched on, in order in this way to prevent both transistors from being switched on at the same time.

The first semiconductor switch, which is driven as a function of the control connection discharge current of the second semiconductor switch, may be a high-side switch, that is to say the semiconductor switch which is connected between a positive supply potential and the output connection, or a low-side switch, that is to say the switch which is connected between the output connection and the reference potential or a negative supply potential. One embodiment of the invention provides for both semiconductor switches to be driven as a function of the control connection current of the respective other semiconductor switch.

The semiconductor switches are preferably MOS transistors, and in this case the control connection of the semiconductor switch corresponds to the gate connection of the transistor, and the load path of the semiconductor switch corresponds to the drain-source path through the transistor.

One embodiment of the invention provides for the enable signal, which is supplied to the drive circuit of the first transistor, also to be dependent on a potential at the control connection of the other transistor. Both the discharge current and the drive potential contain information relating to the switching state of the semiconductor switch. This makes it possible to ensure that the first semiconductor switch is not switched on via the enable signal until both variables indicate that the other semiconductor switch has been switched off.

An enable circuit is provided in order to produce the first enable signal and has a first current measurement configuration, which is connected to the control connection of the second semiconductor switch and produces a current measurement signal. In a corresponding way, a second enable circuit is provided for driving the second semiconductor switch as a function of the control connection current of the first semiconductor switch, and the second enable circuit produces a second enable signal as a function of a second current measurement signal which is supplied from a current measurement configuration.

A comparator is provided in order to compare the current measurement signal with a reference signal, with the comparator output signal forming the enable signal.

If the enable signal is also dependent on the potential at the output of one of the semiconductor switches, then this provides for a signal which is dependent on this potential to be linked by a logic linking element to the comparator output signal, with the enable signal being produced at the output of the logic element.

The first and/or the second drive circuit each preferably has a logic circuit and a driver circuit downstream from the logic circuit, with the logic circuit being supplied with the signal that is dependent on the input signal and with the enable signal. The driver circuit uses an output signal from the logic circuit to produce the respective drive signal for the semiconductor switch.

In order to drive the semiconductor switches, the driver circuits preferably each have a first switching element, which is connected between the control connection of the connected semiconductor switch and a terminal for a first drive potential, and a second switching element, which is connected between the control connection and a terminal for a second drive potential. When using n-channel MOS transistors as the semiconductor switches, one of the terminals for the drive potentials is preferably the source connection of the respective transistor, in order to discharge the transistor that is to be switched off, via the connected switching element, to the reference potential. The first and the second switching element are preferably driven in a complementary manner, in order to avoid switching losses with the switching elements being switched on at the same time.

The subject matter of the invention also relates to a method for driving a semiconductor switch in a half-bridge circuit that has two semiconductor switches, each having a control connection and a load path, with the load paths being connected in series, and with the half-bridge circuit being supplied with an input signal. According to the invention, the first semiconductor switch is driven as a function of the input signal and of a current from or to the control connection of the other semiconductor switch, in order to ensure that the control connection of the other semiconductor switch, particularly the gate when using an MOS transistor, is completely discharged with this being switched off, before the first semiconductor switch is switched on.

The first semiconductor switch is preferably switched on at the earliest when the current at the control connection of the other semiconductor switch has fallen below a predetermined reference value, beyond which it can be assumed that the other semiconductor switch has been switched off.

Furthermore, one embodiment of the invention also provides for the potential at the other semiconductor switch or a drive signal for the other semiconductor switch to be evaluated for driving the first semiconductor switch.

Other features which are considered as characteristic for the invention are set forth in the appended claims.

Although the invention is illustrated and described herein as embodied in a half-bridge circuit and a method for driving it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
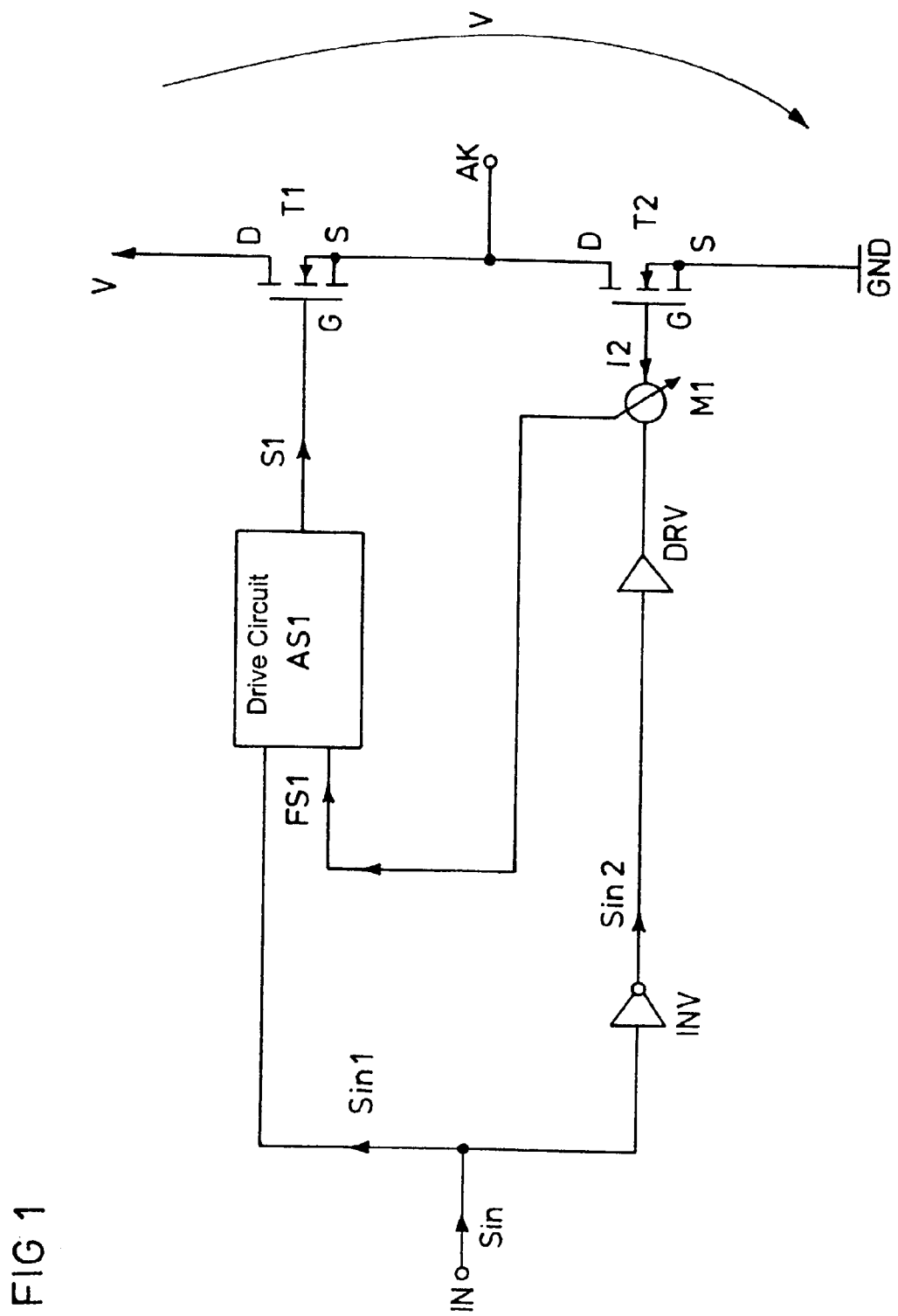
FIG. 1 is a circuit diagram of a half-bridge circuit according to the invention, in which a first semiconductor switch in the half bridge is driven via a drive circuit as a function of an input signal and of a current at a control connection of a second semiconductor switch in the half bridge.

In all the figures of the drawing, sub-features and integral parts that correspond to one another bear the same reference symbol in each case unless expressly stated otherwise. Referring now to the figures of the drawing in detail and first, particularly, to FIG. 1 thereof, there is shown a circuit diagram of a half-bridge circuit according to the invention, which has a first and a second semiconductor switch T1, T2, each of which has a control connection G and a load path D-S. The semiconductor switches T1, T2 in the example are in the form of n-channel MOS transistors, whose gate connection forms the control connection G, and whose drain-source path forms the load path D-S.

The drain-source paths D-S of the transistors T1, T2 are connected in series between terminals for a supply potential V and a reference potential GND, in particular ground. The half-bridge circuit is used for driving a load which can be connected to an output terminal AK but is not illustrated in any more detail, with the load connection which is connected to the output terminal AK being connected to the supply potential when the transistor T1 is switched on, and being connected to the reference potential GND when the transistor T2 is switched on.

The half-bridge circuit has an input terminal IN to which an input signal Sin is applied, on the basis of which the first and the second transistor T1, T2 are switched on or off. The first transistor T1 is driven by a drive circuit AS1, which is connected by one output terminal to the gate connection G of the transistor T1. The drive circuit AS1 of the first semiconductor switch T1 provides a first drive signal S1 for driving the transistor T1, with the drive signal S1 being dependent on a signal Sin1, which is dependent on the input signal Sin and corresponds to the input signal Sin in FIG. 1, and on an enable signal FS1, which is supplied to an input of the drive circuit AS1. The enable signal FS1 is in turn dependent on a current I2 from or to the gate connection G of the transistor T2. The current I2 is detected by a current measurement configuration M1, which is connected upstream of the gate connection G of the transistor T2 and produces a current measurement signal as the enable signal.

In the exemplary embodiment illustrated in FIG. 1, the second transistor T2 is driven by a driver circuit DRV, which essentially acts as a level converter and converts a logic signal level which is applied to its input to a level which is suitable for driving the transistor T2. The driver circuit DRV is necessary since the normal drive level values are 3 to 5 volts, while the power transistors require voltage levels of 10 volts or more at their gate connections. Such a level converter is also provided in the drive circuit AS1, but in a manner which is not illustrated in any more detail. In the exemplary embodiment shown in FIG. 1, the driver circuit DRV is configured to convert a high level at its input to a correspondingly high level at its output, and to convert a low level at its input to a correspondingly low level at its output. In a corresponding way, the drive circuit AS1 converts a high level of the signal Sin1 to a correspondingly high level of the drive signal S1, and converts a low level of the signal Sin1 to a low level of the drive signal S1, in which case it is also necessary to take account of the enable signal FS1, as will be explained in the following text.

First, let us assume that the input signal Sin is at a low level. The signal Sin2 at the input of the driver circuit DRV, which is formed by an inverter INV from the input signal Sin, assumes a high level, which is converted by the driver circuit DRV to a high level that is suitable for switching on the transistor T2, as a result of which the transistor T2 is switched on. The signal Sin1 at the input of the drive circuit ASI corresponds to the input signal Sin and is at a low level, as a result of which the drive signal S1 is also at a low level, and the transistor T1 is switched off. This complementary driving of the transistors T1, T2 in the half-bridge circuit is necessary in order to reduce switching losses which would occur, in particular, if both transistors T1, T2 were switched on at the same time, thus short-circuiting the voltage supply.

If the input signal Sin now changes from the low level to a high level, then the signal Sin2 assumes a low level, on the basis of which the second transistor T2 is switched off, and the low level is converted by the driver circuit DRV to a suitable drive level. In order to switch off the second transistor T2, the charge which is stored in its gate capacitance, which is not illustrated in any more detail, must be dissipated via the driver circuit DRV which, in order to switch off the transistor T2, preferably connects the gate connection to the reference potential GND. The dissipating charge causes a discharge current I2 which is detected by the current measurement configuration M1. The drive circuit AS1 for driving the transistor T1 is in this case configured such that it does not draw the drive signal S1 to a high level until the discharge current I2 from the transistor T2 has fallen below a predetermined reference value, in order to ensure that the gate capacitance of the transistor T2 has been discharged sufficiently in order to switch off the transistor T2 before the transistor T1 is switched on.

Figure 2:
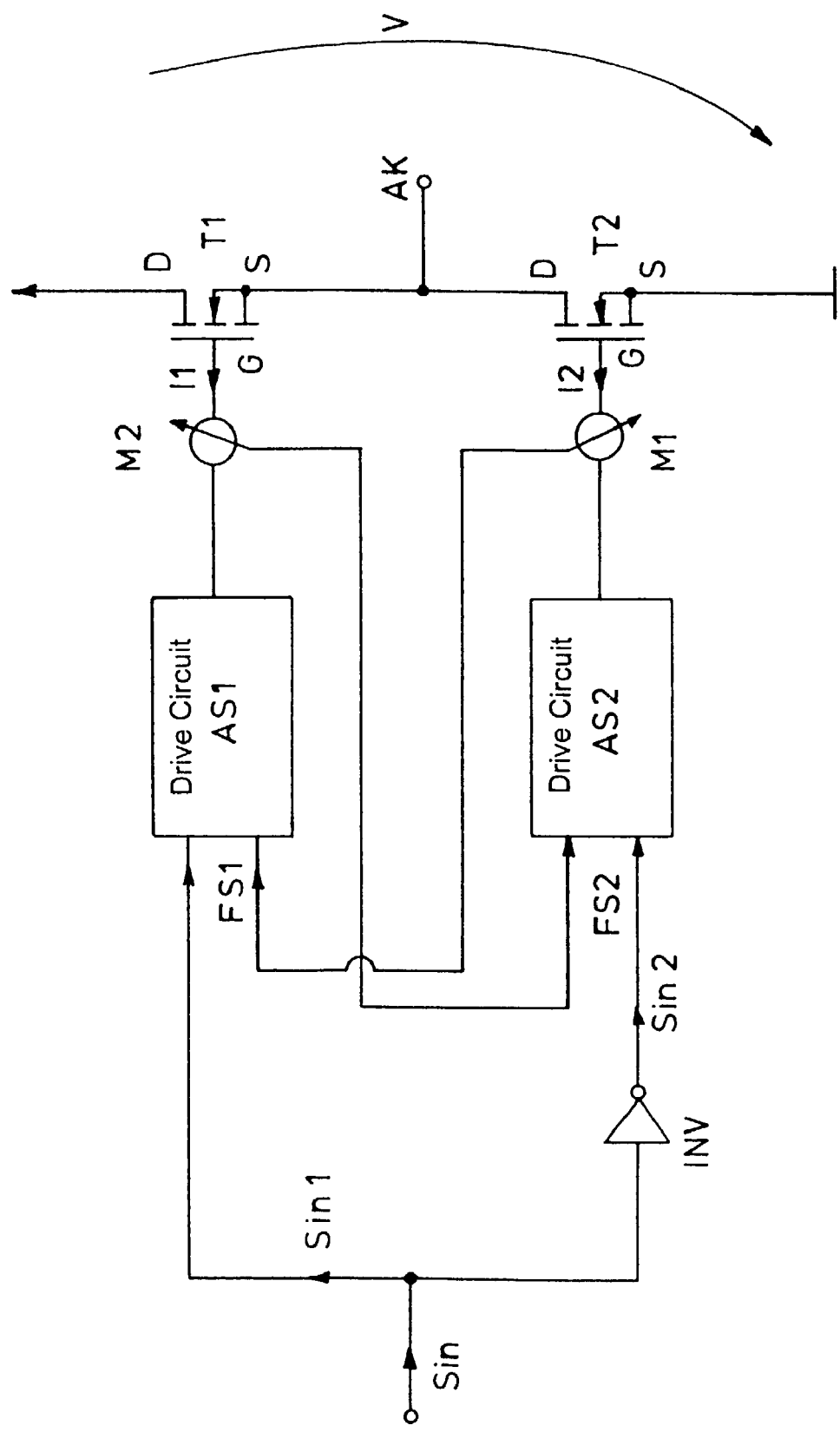
FIG. 2 is a circuit diagram of the half-bridge circuit according to the invention, in which both semiconductor switches in the half bridge are driven via a drive circuit as a function of the input signal and of the current at the control connection of the respective other semiconductor switch in the half bridge.

FIG. 2 shows a second embodiment of the half-bridge circuit according to the invention, in which the first transistor T1 is driven as a function of the discharge current I2 from the second transistor T2, and in which the second transistor T2 is driven as a function of a discharge current I1 from the first transistor T1. In addition to the drive circuit AS1, which has already been explained in conjunction with FIG. 1, and the current measurement configuration M1, this embodiment has a second drive circuit AS2, which is connected by one output terminal to the gate connection G of the second transistor T2. The drive circuit AS2 is supplied with the signal Sin2, which is formed by inversion of the input signal Sin, and with a second enable signal FS2, with the second enable signal FS2 being dependent on the discharge current I1 from the first transistor T1, which is detected by a second current measurement configuration M2 which is connected upstream of the gate connection G of the first transistor T1.

Figure 3:
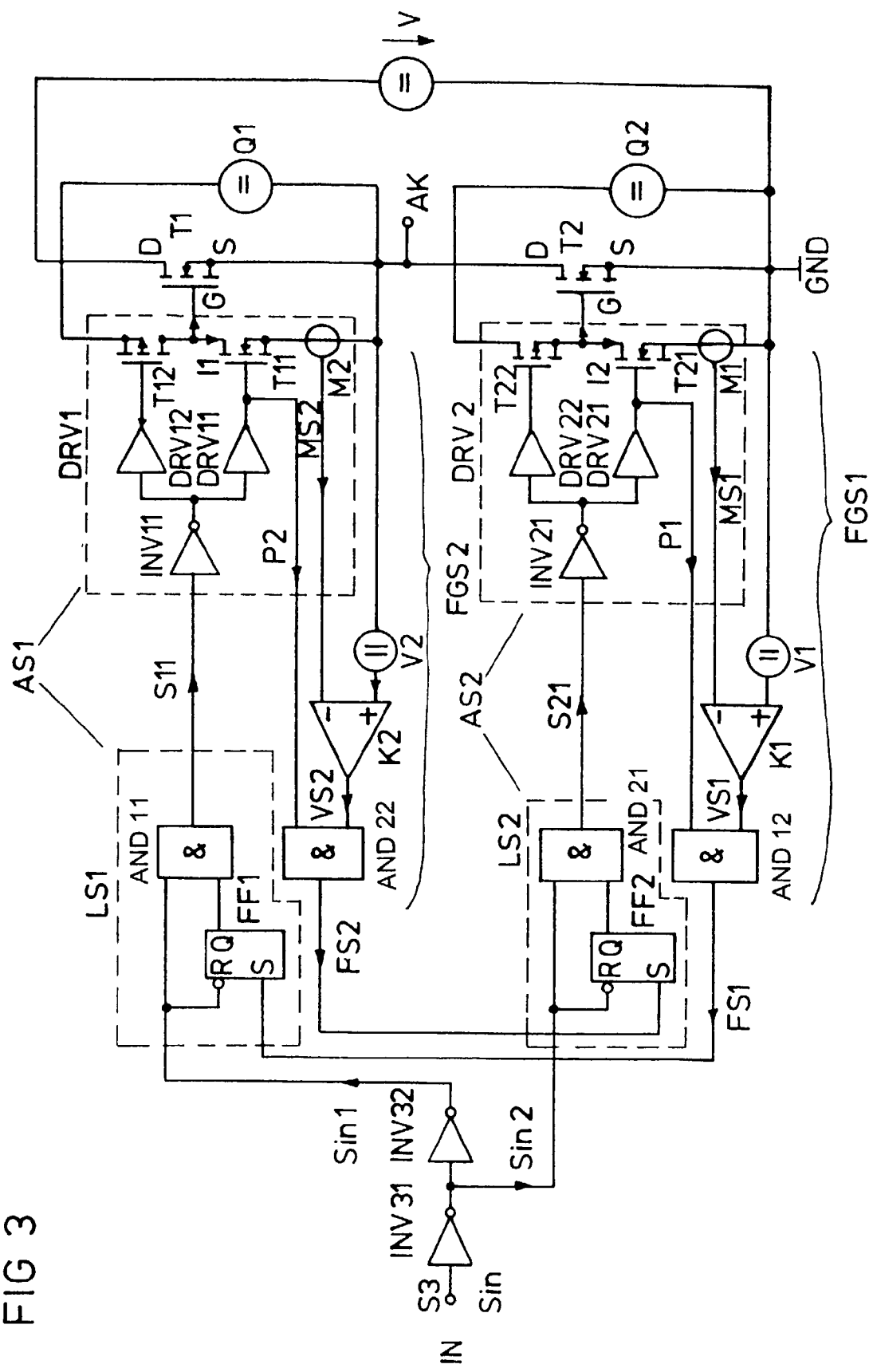
FIG. 3 is a circuit diagram of the half-bridge circuit, in which both semiconductor switches in the half bridge are driven via a drive circuit as a function of an input signal and of a current at the control connection of the respective other semiconductor switch in the half bridge, with one possible embodiment of the drive circuits being illustrated in detail.

FIG. 3 shows a half-bridge circuit according to the invention, in which both the transistors T1, T2 are driven as a function of a discharge current from the gate capacitance of the respective other transistor, with FIG. 3 showing, in detail, the drive circuits AS1, AS2 in order to implement such a function.

Each of the drive circuits AS1, AS2 has a logic circuit LS1, LS2 for linking the respective signal Sin1 or Sin2, which is dependent on the input signal Sin, to the respective enable signal FS1, FS2, and has a driver circuit DRV1, DRV2, downstream from the respective logic circuit LS1, LS2. The configuration and method of operation of the drive circuits will initially be explained with reference to the drive circuit for the transistor T1.

The driver circuit DRV1 for driving the transistor T1 has a series circuit formed by a p-channel MOS transistor T12 and by an n-channel transistor T11, with the drain-source path of the n-channel transistor T11 being connected between the gate connection G and the source connection S of the transistor T1, and with the drain-source paths of the transistors T11, T12 being connected in series to an auxiliary voltage source Q1.

The transistors T11, T12 are each connected to one another by their respective drain connections, and are connected via the junction point to the gate connection G of the transistor T1. The transistors T11, T12 are driven via a common control signal, which is produced at the output of an inverter INV11, with the control signal being amplified via the respective driver circuits DRV12, DRV11, which are connected upstream of the transistors T11, T12. Since the transistors T11, T12 are complementary to one another and are driven by the same drive signal, this ensures that only one of the two transistors T11, T12 is ever switched on. Thus, when the transistor T11 is switched on, the gate capacitance of the transistor T1 is discharged via the transistor to the source potential, and the transistor T1 is switched off. If the transistor T11 is switched off and the transistor T12 is switched on, then the gate connection G of the transistor T1 is connected to a potential which is higher than the source potential S of the transistor T1 by the value of the voltage which is supplied from the auxiliary voltage source Q1, so that this transistor is switched on. The auxiliary voltage source Q1, which is connected by one terminal to the source connection S of the transistor T1, is preferably in the form of a bootstrap circuit, in a well-known manner.

The transistors T11, T12, and hence the transistor T1, are driven on the basis of a signal S11, which is supplied to the inverter INV11. The signal S11 is produced by the logic circuit LS1 as a function of a signal Sin1, which is dependent on the input signal Sin, and as a function of the enable signal FS1. In the example, the signal Sin1 is produced from the input signal Sin, by two series-connected inverters TNV31, INV32, so that its level corresponds to the level of the input signal Sin. The input signal Sin1 is supplied to the reset input R of an RS flip-flop FF1, and to one input of an AND gate AND11. An output connection Q of the flip-flop FF1 is connected to another input of the AND gate AND11, at whose output the signal S11 is produced. A set input S of the flip-flop FF1 is supplied with the enable signal FS1 which, as will be explained in more detail later, is dependent on the discharge current from the second transistor T2 and, additionally, on a drive potential of the transistor T2.

The circuit that is illustrated in FIG. 3 is configured in such a way that the transistor T1 switches off when the input signal Sin is at a low level. Like the signal S11 as well, the signal Sin1 is then at a low level, as a result of which the transistor T11 is switched on via the inverter INV1 and the driver DRV11, in order to short-circuit the gate G and the source S of the transistor T1, and to switch the latter off. If the input signal Sin, and hence the signal Sin1, changes from the low level to a high level, then the flip-flop FF1 is reset, so that a low level is produced at its output Q, as a result of which the signal S11 at the output of the AND gate AND11 assumes a low level despite the signal Sin 1 being at the high level, and the transistor T1 initially remains switched off. In this case, the transistor T1 remains switched off until the enable signal FS1 assumes a high level, in order to set the flip-flop FF1, so that a high level is produced at its output Q. The signal S11 then likewise assumes a high level, as result of which the transistor T11 is switched off via the inverter INV11 and the driver DRV11, and the transistor T12 is switched on via the inverter INV11 and the driver DRV12.

In a corresponding way, the drive circuit for driving the second transistor T2 has a driver circuit DRV2 with a series circuit containing a p-channel transistor T22 and an n-channel transistor T21, which are driven via an inverter INV21 and respective driver circuits DRV22, DRV21 as a function of a signal S21. If the transistor T21, which is connected between the gate connection G and the source connection S of the transistor T2, is in this case switched on, then the gate capacitance is discharged to the reference potential GND via the transistor T21. This results in a discharge current I2, which is detected by the current measurement configuration M1 and is connected in series with the transistor T21, and is used to form the enable signal FS1.

A current measurement signal MS1 which is produced by the current measurement configuration M1 is for this purpose supplied to a negative input of a comparator K1, to whose positive input a reference signal V1 is applied. An output signal VS1 from the comparator K1 in this case remains at a low level for as long as the current measurement signal MS1 remains above the reference signal V1, and/or for as long as the discharge current I2 is greater than a predetermined value, which is dependent on the reference signal V1. The comparison signal VS1, which is produced at the output of the comparator K1, is supplied to an AND gate AND12, at whose output the enable signal FS1 is produced. In addition to being dependent on the discharge current I2 from the transistor T2, the enable signal FS1 in the illustrated exemplary embodiment is also dependent on the drive potential and/or a drive signal for the second transistor T2. The potential and/or the drive signal are/is in turn dependent on the switching state of the transistor T21, which is connected between the gate connection G and the source connection S of the transistor T2, with the second transistor T2 being switched on when the transistor T21 is switched off, and with the second transistor T2 being switched off when the transistor T21 is switched on. The switching state of the transistor T21 is dependent on the potential at its gate connection. A second input of the AND gate AND12 is thus connected to the gate connection of the transistor T21, in order to detect the drive potential for the second transistor T2. A signal P1 which can be tapped off at the gate connection of the transistor T21 in this case assumes a high level when the transistor T21 is switched on, in order to switch the transistor T2 off, and the potential P1 assumes a low level in order to switch the second transistor T2 on. The drive potential for the second transistor T2 is thus directly dependent on the potential P1 at the transistor T21, which can thus be used to evaluate the drive potential for the second transistor T2.

In summary, the enable signal FS1 thus assumes a high level only when the transistor T21 is switched on, in order to switch the transistor T2 off, and when the discharge current I2 from the transistor T2 has fallen below a predetermined value, that is to say when it can be assumed that the transistor T2 has been safely switched off. The half-bridge circuit according to the invention thus ensures that the first transistor T1 is not allowed to be switched on until the second transistor T2 has been safely switched off.

In a corresponding way in the half-bridge circuit illustrated in FIG. 3, the transistor T2 is not switched on until the transistor T1 has been safely switched off. The drive circuit for driving the second transistor T2 has a logic circuit LS2, which corresponds to the first logic circuit LS1, with a flip-flop FF2 and an AND gate AND21. In order to produce a second enable signal FS2, the current measurement configuration M2 is provided in series with the transistor T11 in the driver circuit DRV1, and is followed by a comparator K2 and an AND gate AND22, with one input of the AND gate being connected to the gate connection of the transistor T11. A current measurement signal MS2 that is supplied from the current measurement configuration M2 is compared by the comparator K2 with a reference signal V2.

The logic circuits LS1, LS2, the driver circuits DRV1, DRV2, and the comparator circuits containing the AND gates AND12, AND22 and the comparators K1, K2 are each part of one of the drive circuits AS1, AS2 as shown in FIG. 2.

Depending on the respective application, as is illustrated in FIGS. 2 and 3, it is possible for both the semiconductor switches each to be driven as a function of the discharge current from the other semiconductor switch, or it is possible for only one of the two semiconductor switches in each case to be driven as a function of the discharge current from the respective other semiconductor switch. Although the explanation relating to FIG. 1 has been based on the high-side switch T1 being driven as a function of the discharge current from the low-side switch T2, it is thus self-evident that, instead of the high-side switch T1, the low-side switch T2 may also be driven as a function of the discharge current from the high-side switch.

The AND gate AND12, the comparator K1, the reference voltage source VI and the current measurement configuration M1 in FIG. 3 form an enable circuit FGS1 for producing the first enable signal FS1. In a corresponding way, the AND gate AND22, the comparator K2, the reference voltage source V2 and the current measurement configuration M2 form an enable circuit FGS2 for producing the second enable signal FS2. These enable circuits FGS1, FGS2, which produce enable signals FS1, FS2 as a function of a gate current for the transistors T1, T2 and—in the embodiment illustrated in FIG. 3—as a function of the drive potential for the transistors T1, T2, may be implemented in any other desired manner.

I claim:

1. A half-bridge circuit, comprising:
   a first semiconductor switch having a first control connection and a first load path;
   a second semiconductor switch having a second control connection and a second load path connected in series with said first load path;
   an output terminal disposed between said first and second load paths;
   an input terminal for receiving an input signal;
   at least one drive circuit coupled to said input terminal and having an output connected to said first control connection of said first semiconductor switch and outputting a drive signal at said output, said drive circuit receiving a signal dependent on the input signal and an enable signal dependent on a current from or to said second control connection of said second semiconductor switch, the drive signal being dependent on the input signal and on the current from or to said second control connection of said second semiconductor switch; and
   an enable circuit generating the enable signal and having a current measurement configuration connected in a current path to said second control connection of said second semiconductor switch and providing a current measurement signal on which the enable signal is dependent.

2. The half-bridge circuit according to claim 1, wherein the enable signal is also dependent on a potential at said second control connection of said second transistor or on a drive signal for said second transistor.

3. The half-bridge circuit according to claim 1, wherein:
   said enable circuit has a comparator having inputs receiving the current measurement signal and a reference signal and an output outputting a comparator output signal; and
   said enable circuit has a logic linking element with a first input receiving a signal dependent on a potential at said second control connection of said second semiconductor switch, a second input receiving the comparator output signal, and an output providing the enable signal.

4. The half-bridge circuit according to claim 1, wherein said drive circuit has a logic circuit and a driver circuit disposed downstream from said logic circuit, said logic circuit receiving the input signal and the enable signal and outputs an output signal, said driver circuit receiving and using the output signal from said logic circuit to produce the drive signal.

5. The half-bridge circuit according to claim 4,
   further comprising a first terminal for a first drive potential;
   further comprising a second terminal for a second drive potential; and
   wherein said driver circuit has a first switching element connected between said first control connection of said first semiconductor switch and said first terminal for the first drive potential, and a second switching element connected between said first control connection and said second terminal for the second drive potential.

6. The half-bridge circuit according to claim 5, wherein said first and the second switching elements are driven in a complementary manner depending on the output signal from said logic circuit.

7. The half-bridge circuit according to claim 1, further comprising a second drive circuit having an output connected to said second control connection of said second semiconductor switch and outputting a second drive signal, said second drive circuit receiving a signal dependent on the input signal and a second enable signal dependent on a current from or to said first control connection of said first semiconductor switch, the second drive signal being dependent on the input signal and on the current from or to said first control connection of said first semiconductor switch.

8. A method for driving a half-bridge circuit having first and second semiconductor switches, each of the semiconductor switches having a control connection and a load path connected in series with each other, and the half-bridge circuit receiving an input signal, the method which comprises the step of:
   measuring a current from or to the control connection of the second semiconductor switch resulting in a current measurement signal; and
   driving the first semiconductor switch in dependence on the input signal and the current measurement signal.

9. The method according to claim 8, which comprises switching on the first semiconductor switch no sooner than when the current at the control connection of the second semiconductor switch has fallen below a reference value.

10. The method according to claim 8, which comprises switching on the first semiconductor switch no sooner than when the current at the control connection of the second semiconductor switch has fallen below a current reference value and when a potential at the control connection of the second semiconductor switch has fallen below a potential reference value.

11. The method according to claim 8, which comprises driving the first and second semiconductor switches in dependence on a drive signal and of a current from or to the control connection of a respective other one of the semiconductor switches.

* * * * *